(12) United States Patent
Wölfel

(10) Patent No.: US 10,736,214 B2
(45) Date of Patent: Aug. 4, 2020

(54) PRINTED CIRCUIT BOARD HAVING A MOLDED PART AND METHOD FOR THE PRODUCTION THEREOF

(75) Inventor: Markus Wölfel, Lauf (DE)

(73) Assignee: JUMATECH GMBH, Eckenthal (DE)

( * ) Notice: Subject to any disclaimer, the term of this patent is extended or adjusted under 35 U.S.C. 154(b) by 892 days.

(21) Appl. No.: 14/119,841

(22) PCT Filed: May 23, 2012

(86) PCT No.: PCT/EP2012/002205
§ 371 (c)(1),
(2), (4) Date: Mar. 31, 2014

(87) PCT Pub. No.: WO2012/159753
PCT Pub. Date: Nov. 29, 2012

(65) Prior Publication Data
US 2014/0204553 A1 Jul. 24, 2014

(30) Foreign Application Priority Data
May 24, 2011 (DE) .......... 10 2011 102 484

(51) Int. Cl.
*H01F 5/00* (2006.01)
*H01F 27/28* (2006.01)
*H01F 27/24* (2006.01)
*H01R 9/00* (2006.01)
*H05K 1/11* (2006.01)
(Continued)

(52) U.S. Cl.
CPC ....... *H05K 1/0296* (2013.01); *H01F 27/2804* (2013.01); *H01F 27/2847* (2013.01); *H05K 1/0263* (2013.01); *H05K 1/165* (2013.01);

*H05K 3/202* (2013.01); *H05K 2201/086* (2013.01); *H05K 2201/0969* (2013.01); *Y10T 29/49155* (2015.01)

(58) Field of Classification Search
CPC ............ H01F 27/2847; H01F 27/2804; H05K 1/0263; H05K 1/165; H05K 3/202
USPC ......... 336/200, 232, 234; 361/774; 174/261; 29/846
See application file for complete search history.

(56) References Cited

U.S. PATENT DOCUMENTS 5,434,749 A 7/1995 Nakayama
5,565,837 A * 10/1996 Godek ................ H01F 17/0006
174/250
(Continued)

FOREIGN PATENT DOCUMENTS

CN 1292636 A 4/2001
CN 1672225 A 9/2005
(Continued)

OTHER PUBLICATIONS

Printed Circuit Biard (PCB).*
(Continued)

*Primary Examiner* — Elvin G Enad
*Assistant Examiner* — Kazi S Hossain
(74) *Attorney, Agent, or Firm* — Buchanan Ingersoll & Rooney PC

(57) ABSTRACT

A printed circuit board and a method for the production thereof. The printed circuit board can include a shaped part made of an electrically conducting material and can be used to manage the currents and heat volumes that occur in the field of power electronics.

18 Claims, 5 Drawing Sheets

(51) Int. Cl.
H05K 1/02 (2006.01)
H05K 1/16 (2006.01)
H05K 3/20 (2006.01)

(56) References Cited

U.S. PATENT DOCUMENTS

| | | | | |
|---|---|---|---|---|
| 5,777,539 | A * | 7/1998 | Folker | H01F 27/2804 |
| | | | | 336/200 |
| 6,060,976 | A * | 5/2000 | Yamaguchi | H01F 27/2804 |
| | | | | 336/200 |
| 6,147,583 | A | 11/2000 | Rinne et al. | |
| 8,354,594 | B2 | 1/2013 | Wolfel | |
| 2002/0067235 | A1* | 6/2002 | Ueda | H01F 17/0006 |
| | | | | 336/200 |
| 2002/0145499 | A1* | 10/2002 | Odendaal | H01F 27/2852 |
| | | | | 336/213 |
| 2004/0032313 | A1* | 2/2004 | Ferencz | H01F 27/266 |
| | | | | 336/200 |
| 2004/0229024 | A1* | 11/2004 | Harada | H05K 1/0242 |
| | | | | 428/209 |
| 2004/0257190 | A1* | 12/2004 | Peck | H01F 27/2847 |
| | | | | 336/212 |
| 2005/0270136 | A1 | 12/2005 | Tolle et al. | |
| 2007/0063805 | A1* | 3/2007 | Poynton | H01F 17/0013 |
| | | | | 336/200 |
| 2007/0126112 | A1 | 6/2007 | Cho et al. | |
| 2010/0253465 | A1* | 10/2010 | Yeh | H01F 27/2847 |
| | | | | 336/207 |
| 2012/0105187 | A1* | 5/2012 | Lin | H01F 27/365 |
| | | | | 336/90 |

FOREIGN PATENT DOCUMENTS

| | | |
|---|---|---|
| DE | 8912914 U1 | 12/1989 |
| DE | 29622729 U1 | 5/1997 |
| DE | 10039110 A1 | 4/2001 |
| DE | 1023481 A1 | 2/2004 |
| DE | 202006019812 U1 | 4/2007 |
| DE | 202008007359 U1 | 10/2008 |
| EP | 0387845 A1 | 9/1990 |
| EP | 0961303 A2 | 12/1999 |
| EP | 1737282 A1 | 12/2006 |
| EP | 2043412 A1 | 4/2009 |
| JP | H05(1993)-048379 U | 6/1993 |
| JP | 09-219326 A | 8/1997 |
| JP | H-1056243 A | 2/1998 |
| JP | 2008-004823 | 1/2008 |
| WO | 0191142 A1 | 11/2001 |
| WO | 2007/087982 A1 | 8/2007 |
| WO | 2009121697 A1 | 10/2009 |
| WO | 2011010491 A1 | 1/2011 |

OTHER PUBLICATIONS

Chinese Office Action, Translation of Chinese Office Action issued in corresponding Chinese application serial No. 2012800254204, dated Feb. 29, 2016 (8 pages).

"Prosecution Document; European Patent Office; International Search Report and Written Opinion for PCT/EP2012/002205", dated Nov. 29, 2012, 12 pages.

Translation of Japanese Office Action issued in corresponding Japanese application serial No. 2014-511771, dated Jul. 7, 2015 (2 pages).

European Patent Office, European Patent Office; International Preliminary Report on Patentability dated Aug. 2, 2013 for PCT/EP2012/002205, 23 pages.

German Patent Office, German Patent Office; German Examination Report dated Apr. 4, 2012 for German application No. 102011102484.4, 15 pages.

Japanese Patent Office, Japanese Patent Office; Office Action dated Oct. 28, 2014 for JP 2014-511771, 10 pages.

Office Action dated Jun. 27, 2018 in corresponding European Patent Application No. 12728963.5, and a partial English translation of the pertinent portions thereof.

Office Action dated Feb. 27, 2019, by the German Patent Office in corresponding German Patent Application No. 10 2011 102 484.4. (5 pages).

Office Action dated Mar. 20, 2019, by the European Patent Office in corresponding European Patent Application No. 12 728 963.5. (5 pages).

Office Action dated Jul. 5, 2019, by the German Patent Office in corresponding German Patent Application No. 10 2011 102 484.4 (4 pages).

* cited by examiner

PRINTED CIRCUIT BOARD HAVING A MOLDED PART AND METHOD FOR THE PRODUCTION THEREOF

CROSS-REFERENCE TO PRIOR APPLICATIONS

This application is the U.S. National Stage Application of International Application No. PCT/EP2012/002205, filed on May 23, 2012, which was published as WO 2012/159753 on Nov. 29, 2012, and claims priority to German Patent Application No. 10 2011 102 484.4, filed on May 24 30, 2011. The disclosures of the above-referenced applications are incorporated by reference herein in their entireties.

FIELD

The present disclosure relates to printed circuit boards and methods for making printed circuit boards.

BACKGROUND

The invention relates to a printed circuit board for use in the field of power electronics comprising a shaped part as well as to a method for the production thereof. The expression power electronics generally circumscribes the sub-area of electrical engineering concerning the conversion of electric energy using electronic components. In contrast, the term circuit or control electronics generally means the use of electric power for signal and data processing only.

A printed circuit board of this kind usually comprises etched strip conductors and/or line wires. The term printed circuit board within the meaning of this invention therefore refers to a printed circuit board or to a board that may comprise etched strip conductors and/or line wires.

Usually, strip conductors are manufactured by etching, i.e. portions located between the desired strip conductors are etched off from a copper foil attached onto a carrier plate. However, in printed circuit boards or boards on which wires are attached, line wires made of an electrically conductive material are laid between connection points arranged on the board of the electronic components to be attached to the board, and are cast into a block of insulating material for instance with the board in composite construction. A method of manufacturing such a wire-equipped printed circuit board or board is for instance known from DE 196 18 917 C1.

When using the printed circuit board in the field of power electronics, the wire cross-sections required for handling the occurring currents and heat flow volumes can only be realized with great effort by conventional methods. Thermal problems in the form of overheating often occur. The conventional printed circuit boards are therefore usually limited to predetermined power values.

SUMMARY

Thus, the object of the invention is to provide a printed circuit board for use in the field of power electronics which can be manufactured at comparatively minimal effort and which can handle the currents and heat flow volumes occurring in the field of power electronics.

The object is solved according to the invention by the printed circuit board for use in the field of power electronics as claimed in claim 1, comprising at least one shaped part made of an electrically conductive material extending on and/or in the printed circuit board. By this shaped part the required wire cross-sections to handle the currents and heat flow volumes occurring in the field of power electronics can be generated at a comparatively minimal effort.

A shaped part within the meaning of the invention is preferably a component, which is manufactured in a separation process in which the shape of a workpiece is changed, whereby the shaped part is separated from the workpiece and the final form is contained in the starting form.

Preferred developments of the invention are subject matter of the dependent claims.

It can prove to be advantageous if the printed circuit board comprises at least one connection point for electronic components. Thereby, the currents and heat flow volumes occurring during operation of the electronic components can easily be discharged over the printed circuit board.

It can prove to be helpful if the printed circuit board comprises a substrate made of insulation material, wherein preferably an upper side and/or a lower side and/or at least one of the marginal sides of the shaped part, preferably all marginal sides of the shaped part, are at least partially, preferably completely, covered by the insulating material. Thereby the shaped part can on the one hand be safely integrated into the printed circuit board, and on the other hand, it can at least be partially enclosed by the insulating material so that the risk of short-circuits and the like caused by contact of the shaped part with other electrically conductive elements can substantially be reduced.

It can prove to be useful if the shaped part encompasses a magnetic body at least partially, preferably on all sides, wherein the shaped part and the magnetic body preferably form components of a planar transformer. Such a planar transformer is especially used in power electronics at transmission capacities between 200 and 5000 Watt. The windings of the planar transformer are preferably composed of a plurality of appropriately formed shaped parts separated by the insulation material. Preferably, a transformer core in the shape of a prismatic ferrite or Mu-metal magnetic body is inserted into an hole of the printed circuit board from the upper side of the printed circuit board. To reduce eddy currents, the magnetic body can be sintered. The magnetic body for instance has a thickness of 3.2 mm. To achieve a predetermined transmission ratio, a plurality of transformers can be connected in series or in parallel, depending on the respective need. Thereby the thermal properties and the radio frequency properties can further be improved.

It can prove to be practical if the printed circuit board comprises a plurality of layers with at least one shaped part each, wherein the shaped parts in the plurality of layers are preferably formed identically and are arranged preferably in one direction perpendicular to the upper side of the printed circuit board precisely or mirror-inverted on top of each other, wherein preferably an hole starting out from the upper side and/or the lower side of the printed circuit board extends through a plurality of layers into the printed circuit board, wherein the magnetic body is especially preferably arranged in this hole. Due to this sandwich architecture, a high power density can be achieved in an especially compact constructed space. In an advantageous embodiment the upper side or lower side of the magnetic body lies substantially on one level with the upper side or lower side of the printed circuit board and is flush with the upper side or lower side of the printed circuit board.

In a preferred embodiment of the invention the at least one shaped part fulfills at least one of the following requirements:

The shaped part substantially extends in one plane.
The shaped part is made of metal, preferably of copper.

The shaped part is embedded at least partially, preferably completely, into the printed circuit board.

The upper sides of the printed circuit board and of the shaped part are aligned substantially parallel to each other.

The upper sides of the printed circuit board and of the shaped part lie in one plane and merge preferably in a flush manner.

The shaped part is detached from a plate-shaped workpiece, preferably by punching, eroding or cutting, preferably by water jet cutting.

The shaped part has a thickness in the range of 10 to 2000 μm, preferably in the range of 100 to 1000 μm, preferably in the range of 200 to 500 μm.

A length and/or thickness of the shaped part is at least five times, preferably at least ten times, preferably at least twenty times, preferably at least fifty times or preferably at least hundred times as large as the thickness of the shaped part and/or the thickness of the printed circuit board.

The shaped part has a substantially rectangular cross-section.

The cross-sectional shape of the shaped part varies over the width and/or length of the shaped part.

The thickness of the shaped part is constant across its entire surface.

The shaped part has a curvature in one, two, three or several curvature planes.

The shaped part protrudes over the substrate of the printed circuit board at least partially.

The shaped part cannot be manufactured or is not manufactured using an extrusion process.

The shaped part comprises at least one through-hole, which starting out from a side of the shaped part is worked into the shaped part.

The shaped part comprises at least one hole, which extends from the upper side, lower side or side of the shaped part partially into the shaped part, wherein the hole comprises at least in the area of its opening a circular, oval, polygonal, preferably triangular, quadrangular, pentagonal, preferably rectangular or square contour, wherein the hole is preferably substantially formed in a groove-like manner and extends continuously or discontinuously along a straight or curved line, wherein this line extends especially preferably at least partially in parallel to the side of the shaped part, wherein the through-hole especially preferably is filled at least partially by insulating material.

The shaped part comprises at least one through-hole, which extends transversely, preferably perpendicularly, to the upper side, to the lower side or to a marginal side of the shaped part through the shaped part, wherein the hole comprises at least in the area of its opening a circular, oval, polygonal, preferably triangular, quadrangular, pentagonal, preferably rectangular or square contour, wherein the through-hole is preferably substantially formed slot-like and extends continuously or discontinuously along a straight or curved line, wherein this line extends especially preferably at least partially in parallel to the side of the shaped part, wherein the through-hole especially preferably is filled at least partially by insulating material.

The shaped part is substantially L-shaped, T-shaped, H-shaped, S-shaped, O-shaped, E-shaped, F-shaped, X-shaped, Y-shaped, Z-shaped, C-shaped, U-shaped or Q-shaped.

A plurality of shaped parts are arranged in the same plane or in different planes, preferably in planes parallel to each other within the printed circuit board.

The shaped part comprising at least one of these features can be manufactured in an especially simple manner and can be integrated in the printed circuit board, so that the requested wire cross-sections to handle the currents and heat flow volumes occurring in the field of power electronics can be managed at an especially low effort.

In an advantageous further development of the invention the at least one connection point fulfills at least one of the following requirements:

The connection point is arranged on the upper side of the printed circuit board.

The connection point contacts the shaped part and/or at least one line wire and/or at least one electronic component on at least one contact point, wherein preferably a plurality of contact points are spaced apart from each other at preferably regular spacings.

The shaped part and/or at least one line wire is/are arranged on a lower side of the connection point.

An electronic component and/or at least one line wire is/are arranged or can be arranged on an upper side of the connection point.

The contacting at the at least one contact point is carried out by means of welding, bonding, soldering or conductive adhesion.

The connection point is made of metal, preferably of copper.

The connection point is carved out from a foil, preferably by etching.

The connection point has a thickness in the range of 1 to 200 μm, preferably in the range of 10 to 100 μm, preferably in the range of 20 to 50 μm.

The contour of the connection point corresponds at least partially or completely to the contour of the shaped part at a view onto the upper side of the printed circuit board.

An insulation material is arranged in at least one portion between the connection point and the shaped part, preferably in an area between two contact points and/or in an area surrounding at least one contact points.

A plurality of connection points are connected via the shaped part and/or via at least one line wire and/or via at least one etched strip conductor.

The currents and heat flow volumes of electronic components, particularly of electronic power components can especially well be transmitted to the shaped part via a connection point comprising at least one of these features.

It can be advantageous if circuit electronic components and/or power electronic components are arranged on the printed circuit board. In this combination of electronic components the advantages of the printed circuit board according to the invention especially show to advantage.

A further aspect of the invention refers to a method of manufacturing a printed circuit board, preferably a printed circuit board according to at least one of the preceding embodiments, comprising the following steps:

providing a shaped part made of an electrically conductive material;

contacting the shaped part with an electrically conductive foil with at least one contact point, applying a cover layer onto the side of the foil contacting the shaped part; and carving out at least one connection point of the foil.

It can prove to be advantageous if the method fulfills at least one of the following requirements:

Providing the shaped part is carried out by separating the shaped part from the plate-shaped workpiece, preferably by punching, eroding or cutting, preferably by water jet cutting.

The contacting at the at least one contact point is a carried out by means of welding, bonding, soldering or conductive adhesion, wherein preferably at least in a region between the foil and the shaped part, preferably in a region between two contact points and/or in one region surrounding at least one contact point an insulation material is previously arranged, wherein the insulation material is especially preferably applied onto the shaped part.

The application of a cover layer onto the side of the foil contacting the shaped part is carried out by pressing the side of the foil to a prepreg made of insulation material.

Carving out of at least one connection point from the foil is carried out by etching.

Further advantageous embodiments of the invention result from combination of the features disclosed in the description, the claims and in the Figures.

DETAILED DESCRIPTION

The invention is particularly based on the idea to provide a printed circuit board for use in the field of power electronics, which can be manufactured at comparatively low effort and which can handle currents and heat flow volumes occurring in the field of power electronics. Due to the arrangement of a shaped part made of a conductive material in and/or on the printed circuit board larger wire cross-sections can be realized in the same construction space, which is particularly advantageous when using power electronics, which require large conductive cross-sections for temperature reasons. Furthermore, a lower line cross-section is also achieved in larger wire cross-sections so that very high currents can be transmitted at low loss. As a result, the power electronics can be arranged on one single printed circuit board next to the circuit electronics.

Furthermore, the invention is based on the idea of increasing the power volume of a printed circuit board by a planar transformer.

The printed circuit board according to the invention and a method for the production thereof will now be described in detail with respect to the Figures.

Figure 6:
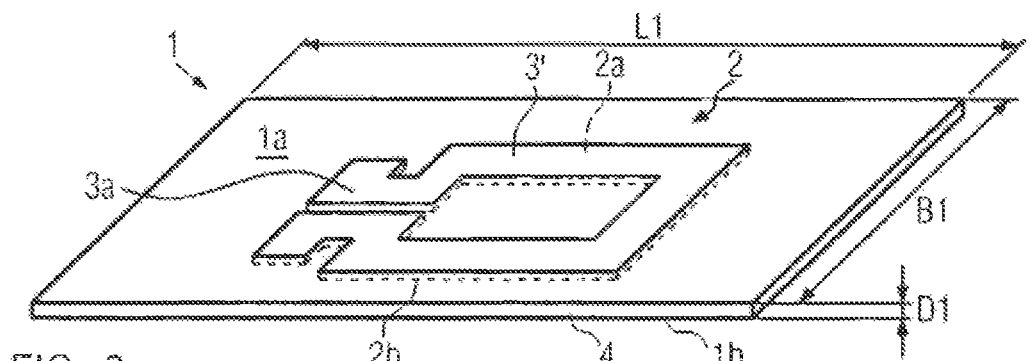
FIG. 6 shows a perspective view of a printed circuit board according to the first embodiment of the invention manufactured according to the method according to the invention, wherein a connection point is carved out from the foil by material removal.

The printed circuit board 1 according to the first embodiment of the invention according to FIG. 6 comprises a plate-shaped and planar shaped part 2 made of copper extending in the printed circuit board 1. The shaped part 2 is embedded in a substrate made of insulating material 4 in a manner that an upper side 2a of the shaped part 2 is on one level with the upper side of the substrate 1a and is flush with the adjoining and surrounding surfaces of the substrate. A lower side 2b and the outer as well as inner and marginal sides 2c, 2d of the shaped part 2 are fully covered by insulating material 4. Optionally, the lower side 2b of the shaped part 2 is located in one plane with the lower side 2a of the substrate and is flush with the adjoining and surrounding surfaces of the substrate, so that the shaped part 2 extends over the entire thickness of the substrate. The outer marginal sides 2c are the outwardly directed marginal sides of the shaped part 2, which define the length L2 and the width B2 of the shaped part 2. Inner marginal sides 2d are the inwardly directed marginal sides of the shaped part 2, which in the present case define a substantially rectangular recess 8, which extends from the outer marginal side 2c into the shaped part 2. A length L2 of the shaped part 2 is for instance approx. 87 mm. A width B2 of the shaped part is e.g. approx. 38 mm and is therefore almost hundred times as large as the thickness D2 of the shaped part 2. The shaped part 2 is detached from a plate-shaped workpiece 5 having a thickness of e.g. 400 µm, preferably by punching, eroding or cutting, preferably by water jet cutting. On the whole, the shaped part is substantially Q-shaped or formed in the shape of the Greek letter Omega. The cross-sectional shape of the shaped part 2 varies over the width B2 and over the length L2 of the shaped part, while the thickness D2 of the shaped part 2 is constant over its entire surface.

The printed circuit board 1 comprises on its upper side a connection point 3' for electronic components, which are removed by etching out of a copper foil 3 having a thickness of 35 μm attached on the upper sides 2a of the shaped part and the substrate 4, so that the contour of the connection point 3' in a view onto the upper side 1a of the printed circuit board corresponds to the contour of the shaped part 2. The connection point 3' contacts the shaped part 2 at several contact points 6, wherein these contact points 6 are approximately spaced apart from each other at regular spacings, and are particularly provided at the corner points of the shaped part 2. The contact at the contact points 6 is for instance a contact by welding, bonding, soldering or conductive adhesion. The shaped part 2 is arranged on a lower side 3b of the connection point 3'. An electronic component is arranged on an upper side 3a of the connection point 3' so that currents and heat can be transferred on a large surface over the connection point 3' between the electronic component and the shaped part 2.

The printed circuit 1 board optionally comprises etched strip conductors e.g. made of copper on the upper side of the substrate, which form an electric circuit. Additionally, a control electronic device and/or a power electronic device with electronic components can be realized on the printed circuit board 1, whose for instance etched connection points communicate with one another by etched strip conductors and/or electrically conductive line wires. At least one of the line wires can extend on and/or in the printed circuit board 1 (between connection points) and/or have a rectangular or square cross-section. Such a line wire is preferably formed as a flat wire made of copper and has the dimensions 0.8*0.3 mm. From the line wire with a rectangular cross-section the side with the larger extension points for instance to the upper side 1a of the printed circuit board 1. The line wire can also have a hollow cross-section so that a coolant can circulate in the hollow cross-section of the line wire. The strip conductors made of copper, the line wires and the electronic components are not shown for the sake of convenience.

The shaped part 2 can be designed in various variants. A small selection of these variants will hereinafter be discussed with reference to FIGS. 8 and 10.

Figure 8:
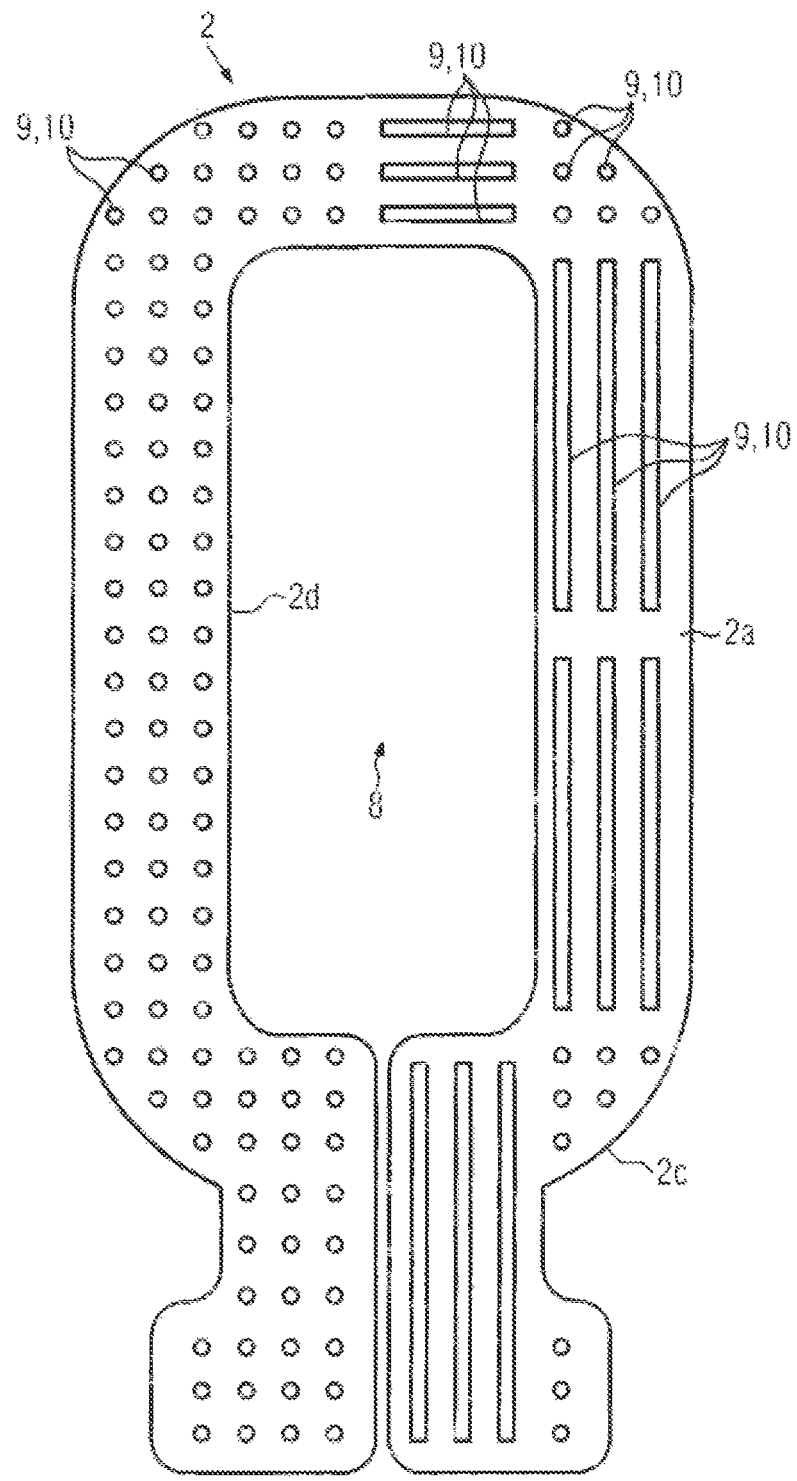
FIG. 8 shows a top plan view of an alternative shaped part for use in the method for manufacturing the printed circuit board according to the invention, wherein the shaped part comprises circular and groove or slot-formed holes and/or through-holes.

The shaped part 2 according to FIG. 8 for instance comprises holes 9 and/or through-holes 10, which extend from the upper side 2a of the shaped part 2 into the shaped part 2. While the through-holes 10 go through from the upper side to the lower side of the shaped part, the holes 9 extend only partially into the shaped part 2 and are limited by a bottom. Contrary to the through-holes 10, the holes 9 are not continuous. In the view of FIG. 8 the holes 9 and through-holes 10 cannot be distinguished from one another and are therefore provided with both reference numerals. The holes 9 and/or through-holes 10 comprise in the area of their holes for instance a circular or rectangular contour. The rectangular holes 9 and/or through-holes 10 extend along straight lines parallel to the marginal sides 2c, 2d of the shaped part 2. The rectangular holes 9 are formed substantially groove-shaped. The hole 9 and/or through-holes 10 are in the embedded condition filled by insulating material 4 of the substrate of the printed circuit board 1 so that the insulating material 4 penetrates the shaped part several times and is responsible for an especially favorable, positive connection with the shaped part 2.

Figure 9:
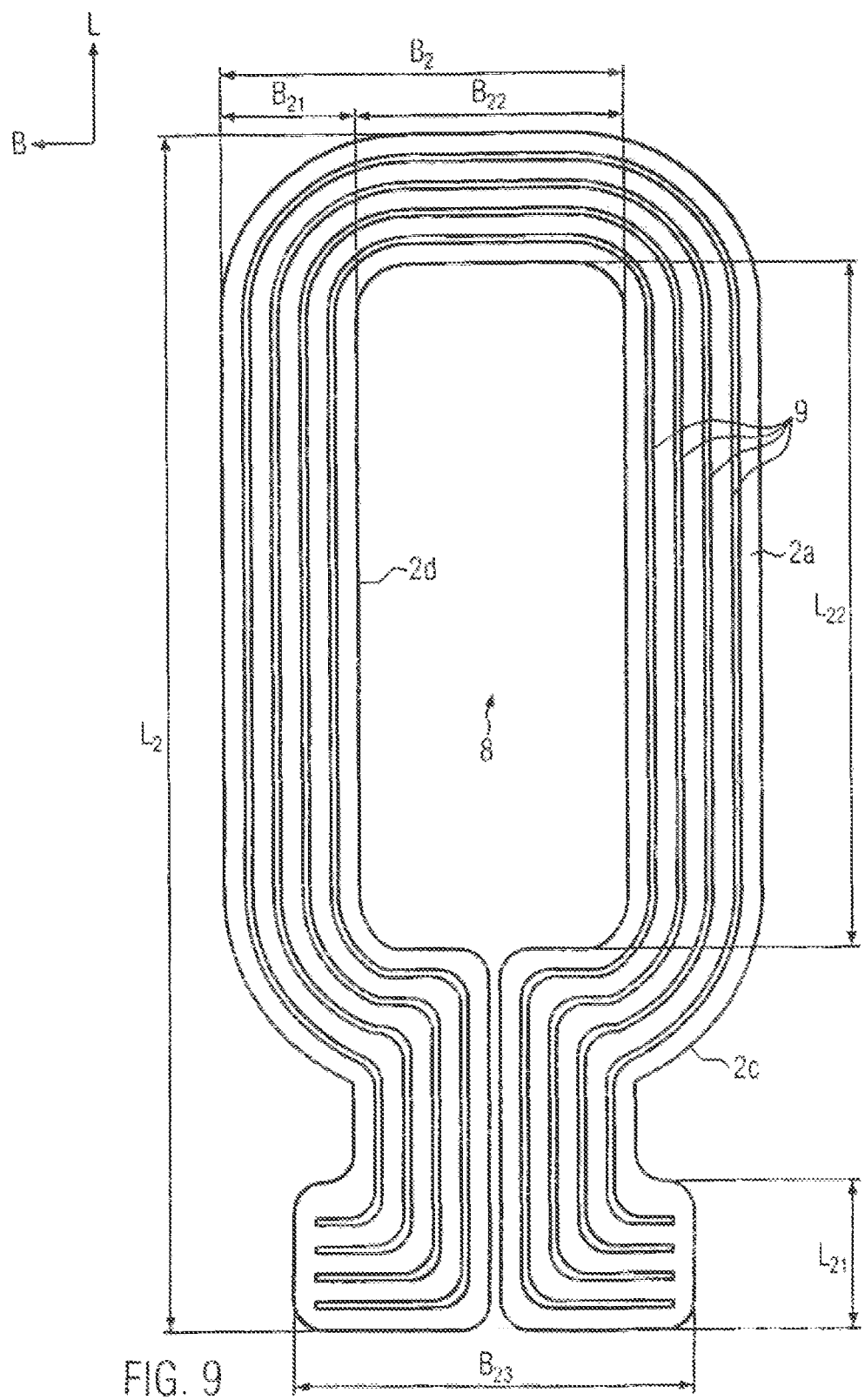
FIG. 9 shows a top plan view onto another alternative shaped part for use in the method for manufacturing the printed circuit board according to the invention, wherein the shaped part comprises groove-shaped holes, which extend continuously along loop-shaped and multi-curved lines substantially parallel to the sides of the shaped part.

The shaped part 2 according to FIG. 9 comprises in a modification of FIG. 8 holes 9, which extend continuously along loop-shaped and multi-curved lines parallel to the marginal sides 2c, 2d of the shaped part substantially around its entire circumference. The preferred dimensions of the shaped part are (+/−10% deviation possible): B3=38 mm; B21=9.5 mm; B22=19 mm; B23=28 mm; L2=86.72 mm; L21=10.6 mm; L22=49.9 mm.

Figure 10:
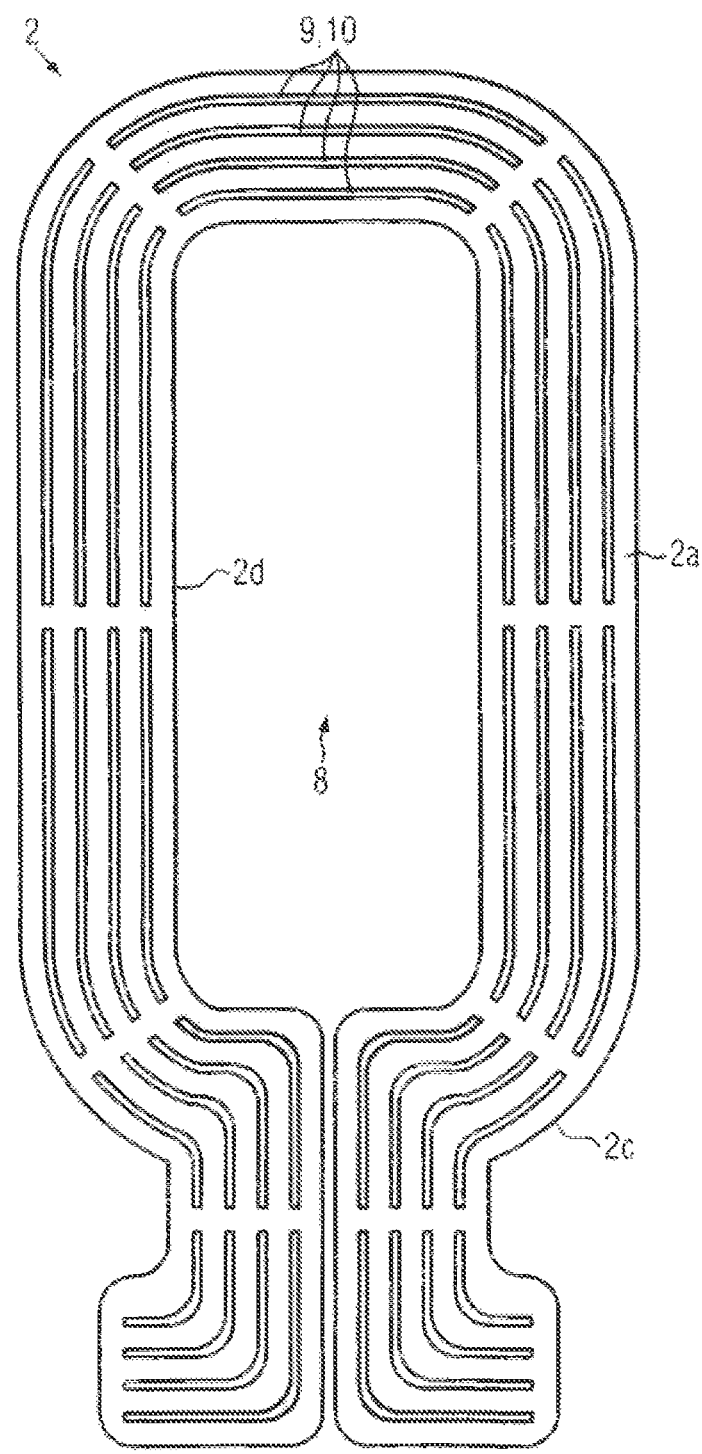
FIG. 10 shows a top plan view of yet another alternative shaped part for use in the method of manufacturing the printed circuit board according to the invention, wherein the shaped part comprises slot-shaped through-holes, which extend discontinuously along loop-shaped and multi-curved lines substantially parallel to the sides of the shaped part.

The shaped part 2 according to FIG. 10 comprises in modification of FIG. 9 through-holes 10, extending discontinuously along loop-shaped and multi-curved lines parallel to the marginal sides 2c, 2d of the shaped part 2 substantially around its entire circumference. A certain rigidity of the shaped part 2 remains despite the numerous through-holes 10 due to the grid-shaped transverse connections of the shaped part 2 between the through-holes 10.

Figure 7:
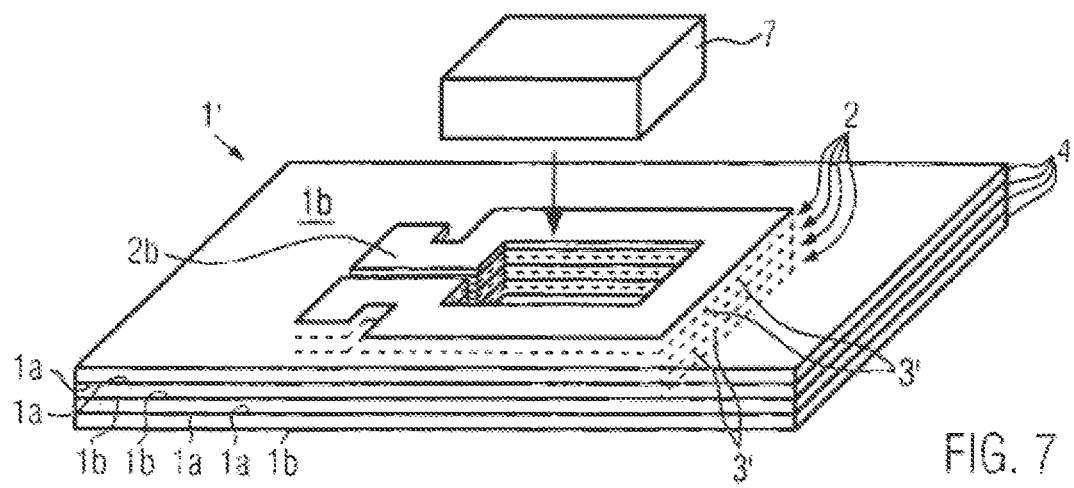
FIG. 7 shows a perspective view of a multi-layer printed circuit board having a substantially identical layer structure according to the second embodiment of the invention, which is manufactured by the method according to the invention, wherein a magnetic body is inserted into an hole extending from the upper side through a plurality of layers of the printed circuit board.

The printed circuit board 1 according to the second embodiment of the invention according to FIG. 7 comprises several layers of printed circuit boards according to the first embodiment of the invention according to FIG. 6 with one shaped part 2 each, wherein the shaped parts 2 in the plurality of layers are formed identically and are precisely stacked in a direction perpendicular to the upper side of the printed circuit board 1. In the embodiment shown in FIG. 7 two adjacent layers are preferably arranged in pairs in a mirror-inverted manner in a manner that their connection points 3' lie directly on top of each other and contact each other. The upper sides 1a, 1a or the lower sides 1b, 1b of two adjacent layers point towards each other. It is helpful that the shaped parts 2 are formed mirror-inverted to their longitudinal axis. A first hole extends, starting out from the upper side of the printed circuit board and from the lower side 1b of the uppermost layer through several layers into to the printed circuit board 1 to receive a sintered Mu-metal magnetic body 7 in this hole. Each shaped part 2 encompasses the magnetic body substantially on its entire circumference to form the windings of a planar transformer around a transformer core in the shape of the magnetic body 7. Thereby, a planar transformer with especially large winding cross-sections and especially high power capacities can be created.

A method of producing a printed circuit board according to the invention comprises the following steps:

step a: providing the shaped part 2 by detaching the shaped part 2 from a plate-shaped workpiece 5, preferably by punching, eroding or cutting, preferably by water jet cutting.

step b: contacting the shaped part 2 with the electrically conductive foil 3 at the at least one contact portion 6 by welding, bonding or conductive adhesion, wherein preferably in at least one portion between the foil 3 and the shaped part, preferably in a portion between two contact points 6 and/or in a portion which encompasses at least one contact point 6, insulation material 4 is previously arranged, wherein the insulation material 4 is especially preferably applied onto the shaped part 2.

step c: applying a cover layer 4 onto the side 3b of the foil 3 connected to the shaped part 2 by pressing the side 3b of the foil 3 to a prepreg made of insulating material.

step d: carving out at least one connection point 3' from the foil by etching.

Figure 1:
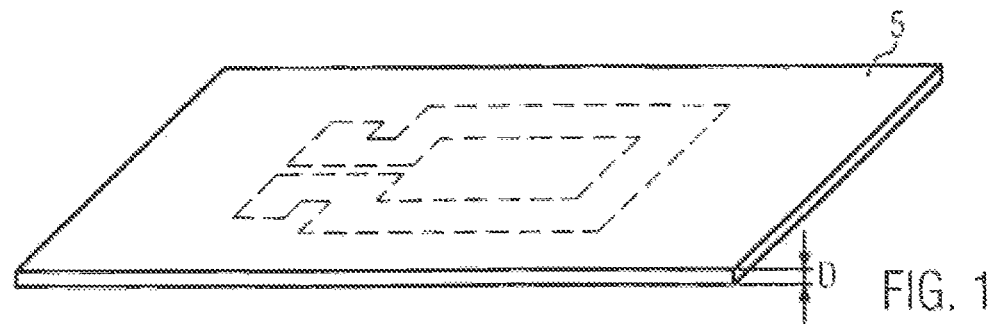
FIG. 1 shows a perspective view of an intermediate product in a method of manufacturing a printed circuit board according to the invention, wherein the contour of a shaped part is sketched on a plate-shaped, electrically conductive workpiece to detach the shaped part from the workpiece along the contour.

FIG. 1 shows a perspective view of a copper plate 5 having a thickness of 400 μm on which the contour of a shaped part is sketched to detach the shaped part along the contour according to step a from the workpiece.

Figure 2:
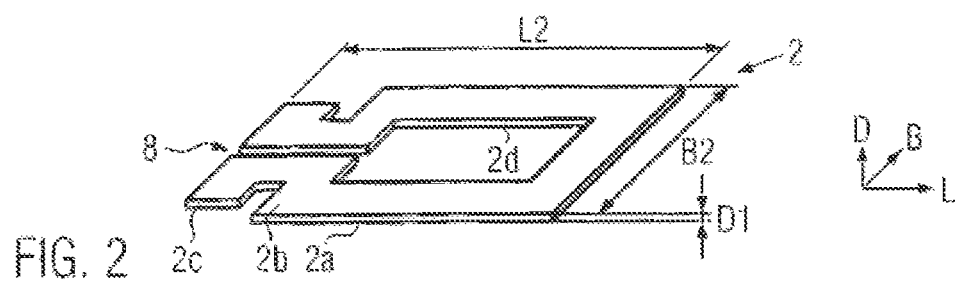
FIG. 2 shows a perspective view of a further intermediate product in a method of manufacturing the printed circuit board according to the invention, wherein the shaped part is detached from the plate-shaped workpiece.

FIG. 2 shows a perspective view of the shaped part 2 detached from the copper plate according to step a. The side of the shaped part 2 provided for contacting the foil 3 or the connection point is preferably coated with an insulation material 4, wherein the portions provided for contacting the foil 3 or the connection point 3', at which the later contact points 6 are located, are spared. Thereby the shaped part 2 can be optimally positioned with respect to the foil 3. Furthermore, the contact points 6 can be specially precisely defined and specially easily produced by welding, bonding, soldering or conductive adhesion, since the contact between the shaped part 2 and the foil 3 is only possible in the portions spared by the insulation material, but not in the portions in which the insulation material 4 is arranged between the shaped part 2 and the foil 3.

Figure 3:
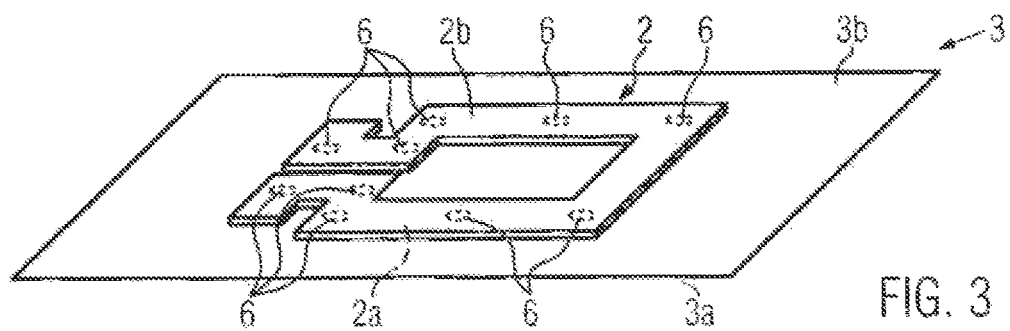
FIG. 3 shows a perspective view of a further intermediate product in the method of manufacturing the printed circuit board according to the invention, according to which the shaped part contacts an electrically conductive foil at contact points.

FIG. 3 shows a perspective view of a further intermediate product in the method of producing the printed circuit board according to the invention according to step b, according to which the upper side 2a of the shaped part 2 contacts the lower side 3b of an electrically conductive copper foil 3 having a thickness of 35 μm at contact points 6. Reference numeral 3a designates an upper side of the copper foil 3.

Figure 4:
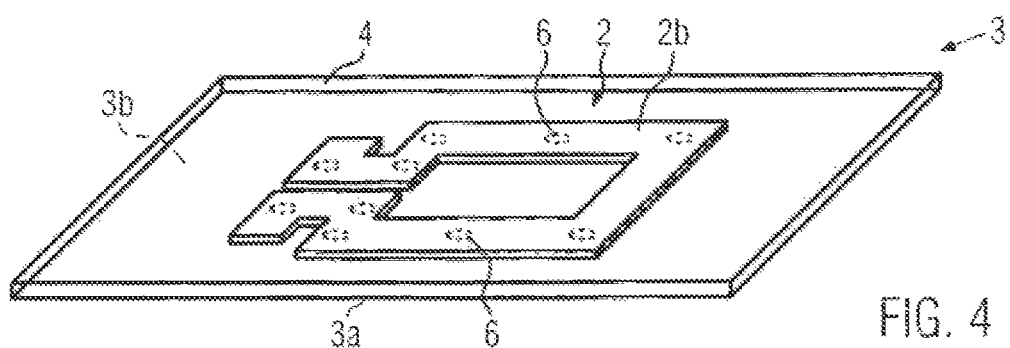
FIG. 4 shows a perspective view of a further intermediate product in the method of manufacturing the printed circuit board according to the invention with viewing direction towards the lower side of the intermediate product, wherein the lower side of the foil contacting the shaped part is provided with an electrically insulating cover layer to embed the shaped part and to electrically insulate it.

FIG. 4 shows a perspective view of a further intermediate product with a viewing direction onto the lower side thereof, wherein the lower side 3b of the foil contacting the shaped part 2 in accordance with step c is provided with an electrically conductive cover layer to embed the shaped part 2 and to electrically insulate it.

Figure 5:
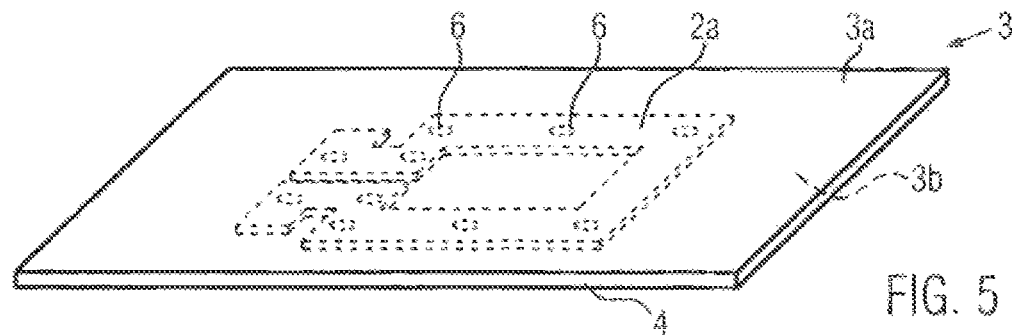
FIG. 5 shows another perspective view of the intermediate product according to FIG. 4 with viewing direction toward the upper side of the intermediate product.

FIG. 5 shows another perspective view of the intermediate product according to FIG. 4 with a viewing direction onto the upper side of the intermediate product.

The etching of the copper foil 3 is carried out according to the invention only after embedding the shaped part 2 into the insulation material 4 which forms the substrate of the printed circuit board 1 to carve out the portions of the contact points 6 from the copper foil 3 for forming a connection point 3'. Since the position of the shaped part 2 and the positions of the contact points 6 are already previously known, the connections of the shaped part 2 with the actually not yet existing connection point 3' can already be manufactured before embedding the shaped part 2 into the insulation material 4 and/or before carving out the connection point 3' from the copper foil 3.

The invention is not limited to the embodiments described. Further advantageous embodiments result from a combination of the features of the individual embodiments.

The invention claimed is:

1. A printed circuit board, comprising
a substrate made of insulation material;
at least one connection point made from a metal foil; and
at least one shaped part made of an electrically conductive material, the at least one connection point in contact with the shaped part on at least one contact point;
wherein the contacting at the at least one contact point is a contacting by welding, bonding, soldering or conductive adhesion
wherein the shaped part includes
at least one recess, which extends from an outer marginal side into the shaped part, and at least one of
a hole extending from an upper side, a lower side, a first marginal side, or a second marginal side of the shaped part into and not through the shaped part; or
a through-hole, which extends transversely to the upper side, the lower side, the first marginal side, or the second marginal side of the shaped part through the shaped part,
wherein the shaped part is embedded in the substrate made of insulation material, so that the marginal sides of the shaped part are directly covered by the insulation material, and the hole or through-hole is filled with the insulation material,
a length and/or width of the shaped part is at least five times as large as the thickness of the shaped part and/or the thickness of the printed circuit board.

2. The printed circuit board of claim 1, wherein
the substrate made of insulation material covers at least a portion of the upper side, or the lower side of the shaped part.

3. The printed circuit board of claim 1, wherein the shaped part at least partially surrounds a magnetic body within the recess such that the shaped part and the magnetic body form at least a portion of a planar transformer.

4. The printed circuit board of claim 3, wherein a plurality of shaped parts are provided, each shaped part being associated with a circuit board layer, which together with a first layer forms a plurality of layers;
wherein
the shaped parts in the plurality of layers are stacked on top of each other in a mirror-inverted manner in a direction perpendicular to an upper side of the printed circuit board; and
the shaped parts in the plurality of layers surround an opening defined by the recesses of the shaped parts, said opening extending through the plurality of layers, the magnetic body being arranged in the opening.

5. The printed circuit board of claim 4, wherein each of the plurality of shaped parts have substantially the same shape.

6. The printed circuit board of claim 1, wherein the at least one shaped part fulfills at least one of the following:
the shaped part extends substantially in one plane;
the shaped part is made of metal;
the upper side of the printed circuit board layer is aligned substantially in parallel to the upper side of the shaped part;
the shaped part is separated from a plate-shaped workpiece, by punching, eroding, cutting, or water jet cutting;
the shaped part has a thickness in the range of 10 to 2000 μm, or in the range of 100 to 1000 μm, or in the range of 200 to 500 μm;
the shaped part has a substantially rectangular cross-section;
the cross-sectional shape of the shaped part varies across the width and/or across the length of the shaped part;
the thickness of the shaped part is constant across its entire surface;
the shaped part has a curvature in one, two, three or more curvature planes;
the shaped part projects at least partially from a substrate of the printed circuit board;
the shaped part includes at least in an area of the through-hole a circular, oval, polygonal, preferably triangular, quadrangular, pentagonal, rectangular or square contour, wherein the opening is substantially groove-shaped and extends continuously or discontinuously along a straight or curved line, wherein this line extends at least partially in parallel to a marginal side of the shaped part;
the hole of the shaped part extends perpendicular to the upper side, to the lower side, to the first marginal side, or to the second marginal side of the shaped part through the shaped part, wherein the hole is substantially slot-shaped and extends continuously or discontinuously along a straight or curved line, extending at least partially in parallel to one the first and second a marginal sides of the shaped part; and a plurality of shaped parts are arranged in the same plane, in different planes, or in planes parallel to each other within the printed circuit board.

7. The printed circuit board of claim 1, wherein the at least one connection point fulfills at least one of the following:
the connection point is arranged on an upper side of a printed circuit board layer;
the connection point contacts the shaped part and/or at least a line wire and/or at least an electronic component on at least one contact point, wherein a plurality of contact points in regular spacings are spaced apart from each other;
the shaped part and/or at least one line wire is arranged on a lower side of the connection point;
the connection point is made from the foil by etching;
the connection point has a thickness in the range of 1 to 200 µm, or in the range of 10 to 100 µm, or in the range of 20 to 50 µm;
an insulation material is arranged in at least one portion between the connection point and the shaped part, or in a portion between two contact points, and/or in a portion that encompasses at least one contact point; and
a plurality of connection points communicate via the shaped part and/or via at least one line wire and/or via at least one etched strip conductor.

8. A printed circuit board, comprising a substrate made of insulation material;
at least one connection point made from a metal foil; and
at least one shaped part made of an electrically conductive material, the at least one connection point in contact with the shaped part on at least one contact point;
wherein the contacting at the at least one contact point is a contacting by welding, bonding, soldering or conductive adhesion;
wherein the shaped part includes
at least one recess, which extends from an outer marginal side into the shaped part, and
a hole extending from an upper side, a lower side, a first marginal side, or a second marginal side of the shaped part into and not through the shaped part;
wherein the shaped part is embedded in the substrate made of insulation material, so that the marginal sides of the shaped part are covered by the insulation material, and the hole is filled with the insulation material,
a length and/or width of the shaped part is at least five times as large as the thickness of the shaped part and/or the thickness of the printed circuit board.

9. The printed circuit board of claim 8, wherein
the substrate made of insulation material covers at least a portion of the upper side, or the lower side of the shaped part.

10. The printed circuit board of claim 8, wherein the shaped part at least partially surrounds a magnetic body within the recess such that the shaped part and the magnetic body form at least a portion of a planar transformer.

11. The printed circuit board of claim 10, wherein a plurality of shaped parts are provided, each shaped part being associated with a circuit board layer, which together with a first layer forms a plurality of layers;
wherein
the shaped parts in the plurality of layers are stacked on top of each other in a mirror-inverted manner in a direction perpendicular to an upper side of the printed circuit board; and
the shaped parts in the plurality of layers surround an opening defined by the recesses of the shaped parts, said opening extending through the plurality of layers, the magnetic body being arranged in the opening.

12. The printed circuit board of claim 10, wherein each of the plurality of shaped parts have substantially the same shape.

13. The printed circuit board of claim 8, wherein the at least one shaped part fulfills at least one of the following:
the shaped part extends substantially in one plane;
the shaped part is made of metal;
the upper side of the printed circuit board layer is aligned substantially in parallel to the upper side of the shaped part;
the shaped part is separated from a plate-shaped workpiece, by punching, eroding, cutting, or water jet cutting;
the shaped part has a thickness in the range of 10 to 2000 µm, or in the range of 100 to 1000 µm, or in the range of 200 to 500 µm;
the shaped part has a substantially rectangular cross-section;
the cross-sectional shape of the shaped part varies across the width and/or across the length of the shaped part;
the thickness of the shaped part is constant across its entire surface;
the shaped part has a curvature in one, two, three or more curvature planes;
the shaped part projects at least partially from a substrate of the printed circuit board;
the shaped part includes at least in an area of the through-hole a circular, oval, polygonal, preferably triangular, quadrangular, pentagonal, rectangular or square contour, wherein the opening is substantially groove-shaped and extends continuously or discontinuously along a straight or curved line, wherein this line extends at least partially in parallel to a marginal side of the shaped part;
the hole of the shaped part extends perpendicular to the upper side, to the lower side, to the first marginal side, or to the second marginal side of the shaped part through the shaped part, wherein the hole is substantially slot-shaped and extends continuously or discontinuously along a straight or curved line, extending at least partially in parallel to one the first and second a marginal sides of the shaped part; and
a plurality of shaped parts are arranged in the same plane, in different planes, or in planes parallel to each other within the printed circuit board.

14. The printed circuit board of claim 8, wherein the at least one connection point fulfills at least one of the following:
the connection point is arranged on an upper side of a printed circuit board layer;
the connection point contacts the shaped part and/or at least a line wire and/or at least an electronic component on at least one contact point, wherein a plurality of contact points in regular spacings are spaced apart from each other;
the shaped part and/or at least one line wire is arranged on a lower side of the connection point;
the connection point is made from the foil by etching;
the connection point has a thickness in the range of 1 to 200 µm, or in the range of 10 to 100 µm, or in the range of 20 to 50 µm;
an insulation material is arranged in at least one portion between the connection point and the shaped part, or in a portion between two contact points, and/or in a portion that encompasses at least one contact point; and a plurality of connection points communicate via the shaped part and/or via at least one line wire and/or via at least one etched strip conductor.

15. A printed circuit board, comprising
a substrate made of insulation material;
a plurality of connection points made from a metal foil; and
a plurality of shaped parts made of an electrically conductive material, at least one connection point of the plurality of connection points in contact with a respective shaped part of the plurality of shaped parts, on at least one contact point;
wherein the contacting at the at least one contact point is a contacting by welding, bonding, soldering or conductive adhesion;
wherein each shaped part includes
at least one recess, which extends from an outer marginal side into the shaped part, and at least one of
a hole extending from an upper side, a lower side, a first marginal side, or a second marginal side of the shaped part into and not through the shaped part; or a through-hole, which extends transversely to the upper side, the lower side, the first marginal side, or the second marginal side of the shaped part through the shaped part,
each shaped part being associated with a circuit board layer, which together with a first layer forms a plurality of layers;
wherein
each shaped part in the plurality of layers are stacked on top of each other in a mirror-inverted manner in a direction perpendicular to an upper side of the printed circuit board; and
each shaped part in the plurality of layers surround an opening defined by the recesses of the shaped parts, said opening extending through the plurality of layers, the magnetic body being arranged in the opening,
wherein each shaped part is embedded in the substrate made of insulation material, so that the marginal sides of each shaped part are covered by the insulation material, and the hole or through-hole is filled with the insulation material,
a length and/or width of each shaped part is at least five times as large as the thickness of the each shaped part and/or the thickness of the printed circuit board.

16. The printed circuit board of claim 15, wherein
the substrate made of insulation material covers at least a portion of the upper side, or the lower side of each shaped part.

17. The printed circuit board of claim 15, wherein each shaped part at least partially surrounds a magnetic body within the recess such that each shaped part and the respective magnetic body form at least a portion of a planar transformer.

18. The printed circuit board of claim 15, wherein each connection point fulfills at least one of the following:
each connection point is arranged on an upper side of a printed circuit board layer;
each connection point contacts the respective shaped part and/or at least a line wire and/or at least an electronic component on at least one contact point, wherein a plurality of contact points in regular spacings are spaced apart from each other;
the respective shaped part and/or at least one line wire is arranged on a lower side of each connection point;
the connection point is made from the foil by etching;
the connection point has a thickness in the range of 1 to 200 μm, or in the range of 10 to 100 μm, or in the range of 20 to 50 μm;
an insulation material is arranged in at least one portion between each connection point and the respective shaped part, or in a portion between two contact points, and/or in a portion that encompasses at least one contact point; and
a plurality of connection points communicate via the respective shaped part and/or via at least one line wire and/or via at least one etched strip conductor.

* * * * *